(12) United States Patent
Kuo et al.

(10) Patent No.: US 7,661,853 B2
(45) Date of Patent: Feb. 16, 2010

(54) LIGHT EMITTING DIODE LAMP

(75) Inventors: Jer-Haur Kuo, Taipei Hsien (TW); Ye-Fei Yu, Shenzhen (TW); Xin-Xiang Zha, Shenzhen (TW); Lin Yang, Shenzhen (TW); Shu-Yuan Xu, Shenzhen (TW)

(73) Assignees: Fu Zhun Precision Industry (Shen Zhen) Co., Ltd., Shenzhen, Guangdong Province (CN); Foxconn Technology Co., Ltd., Tu-Cheng, Taipei Hsien (TW)

( * ) Notice: Subject to any disclaimer, the term of this patent is extended or adjusted under 35 U.S.C. 154(b) by 0 days.

(21) Appl. No.: 12/110,340

(22) Filed: Apr. 27, 2008

(65) Prior Publication Data

US 2009/0251901 A1    Oct. 8, 2009

(30) Foreign Application Priority Data

Apr. 3, 2008    (CN) .................. 2008 2 0092994 U

(51) Int. Cl.
*F21V 29/00*    (2006.01)

(52) U.S. Cl. .................. 362/373; 362/249.02; 362/294; 362/650; 165/104.33

(58) Field of Classification Search .................. 362/294, 362/373, 547, 649–651, 800, 249.02; 165/104.33
See application file for complete search history.

(56) References Cited

U.S. PATENT DOCUMENTS

2007/0253202 A1* 11/2007 Wu et al. .................. 362/294
2007/0285926 A1* 12/2007 Maxik ........................ 362/294

* cited by examiner

*Primary Examiner*—Stephen F Husar
(74) *Attorney, Agent, or Firm*—Frank R. Niranjan

(57) ABSTRACT

An LED lamp (10) includes a lamp base (100), an optical lens system (400), an LED (500) mounted in the optical lens system and a heat dissipation device (300) interconnecting the lamp base and the optical lens system. The heat dissipation device includes a heat sink (334) and a heat pipe (332). The heat sink includes a central block (3340), a plurality of fins (3342) mounted on an outer circumferential face of the central block and a receiving hole (3346) defined axially through the central block. The heat pipe is circumferentially retained in the receiving hole and in thermal contact with the LED.

18 Claims, 5 Drawing Sheets

LIGHT EMITTING DIODE LAMP

BACKGROUND

1. Technical Field

The present invention generally relates to a light emitting diode (LED) lamp, and particularly to an LED lamp having a heat dissipation device for heat dissipation.

2. Description of Related Art

An LED lamp is a type of solid state lighting that utilizes light-emitting diodes (LEDs) as a source of illumination. An LED is a device for transferring electricity to light by using a theory that, if a current is made to flow in a forward direction in a junction comprising two different semiconductors, electrons and holes are coupled at the junction region to generate a light beam. The LED has an advantage that it is resistant to shock, and has an almost eternal lifetime under a specific condition; thus, the LED lamp is intended to be a cost-effective yet high quality replacement for incandescent and fluorescent lamps.

An LED is relatively small in size and produces heat while the LED emits light. Therefore, the LED usually has a high heat flux, which decreases the optical output of the LED. Since generally LED lamps do not have heat dissipation devices with good heat dissipating efficiencies, operation of the general LED lamps has a problem of instability because of the rapid build up of heat. Consequently, the light from the LED lamp often flickers, which degrades the quality of the illumination. Furthermore, the LED lamp is used in a high heat state for a long time and the life time thereof is consequently shortened.

Therefore, what is needed, is an LED lamp which has a greater heat-dissipation capability.

SUMMARY

The present invention provides an LED lamp. The LED lamp comprises a lamp base, an optical lens system, an LED mounted in the optical lens system and a heat dissipation device thermally contacting with the LED and interconnecting the lamp base and the optical lens system. The heat dissipation device comprises a heat sink, a heat pipe and a fan for generating an airflow through the heat sink. The heat sink comprises a central block, a plurality of fins radially and outwardly extending from an outer circumferential face of the central block and a receiving hole defined axially through the central block. The heat pipe is interferentially fitted in the receiving hole and in thermal contact with the LED.

Other advantages and novel features of the present invention will become more apparent from the following detailed description of preferred embodiments when taken in conjunction with the accompanying drawings.

DETAILED DESCRIPTION

Figure 1:
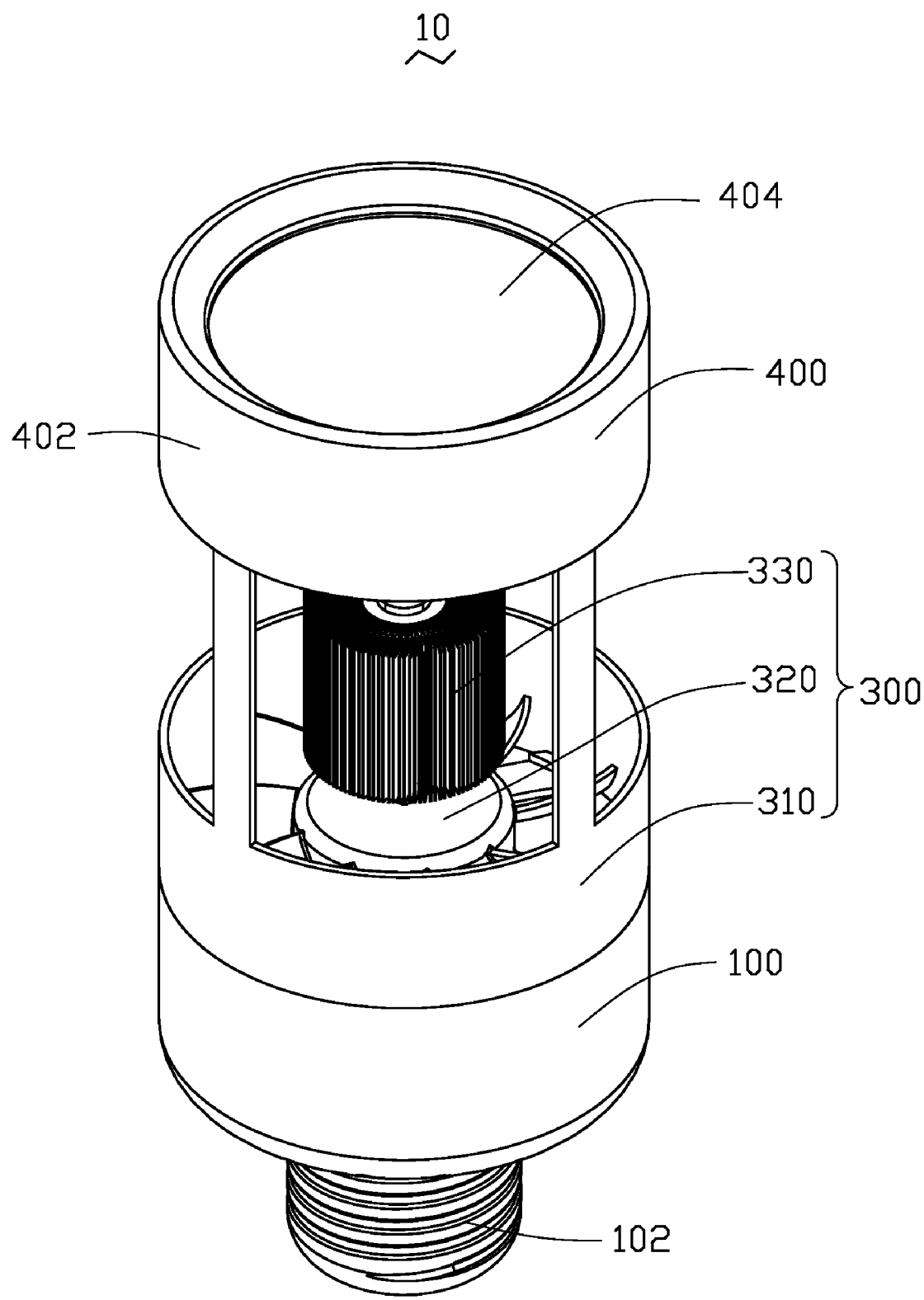
FIG. 1 is an isometric view of an LED lamp in accordance with a first preferred embodiment of the present invention.

Reference will now be made to the drawing figures to describe the preferred embodiments in detail.

Figure 2:
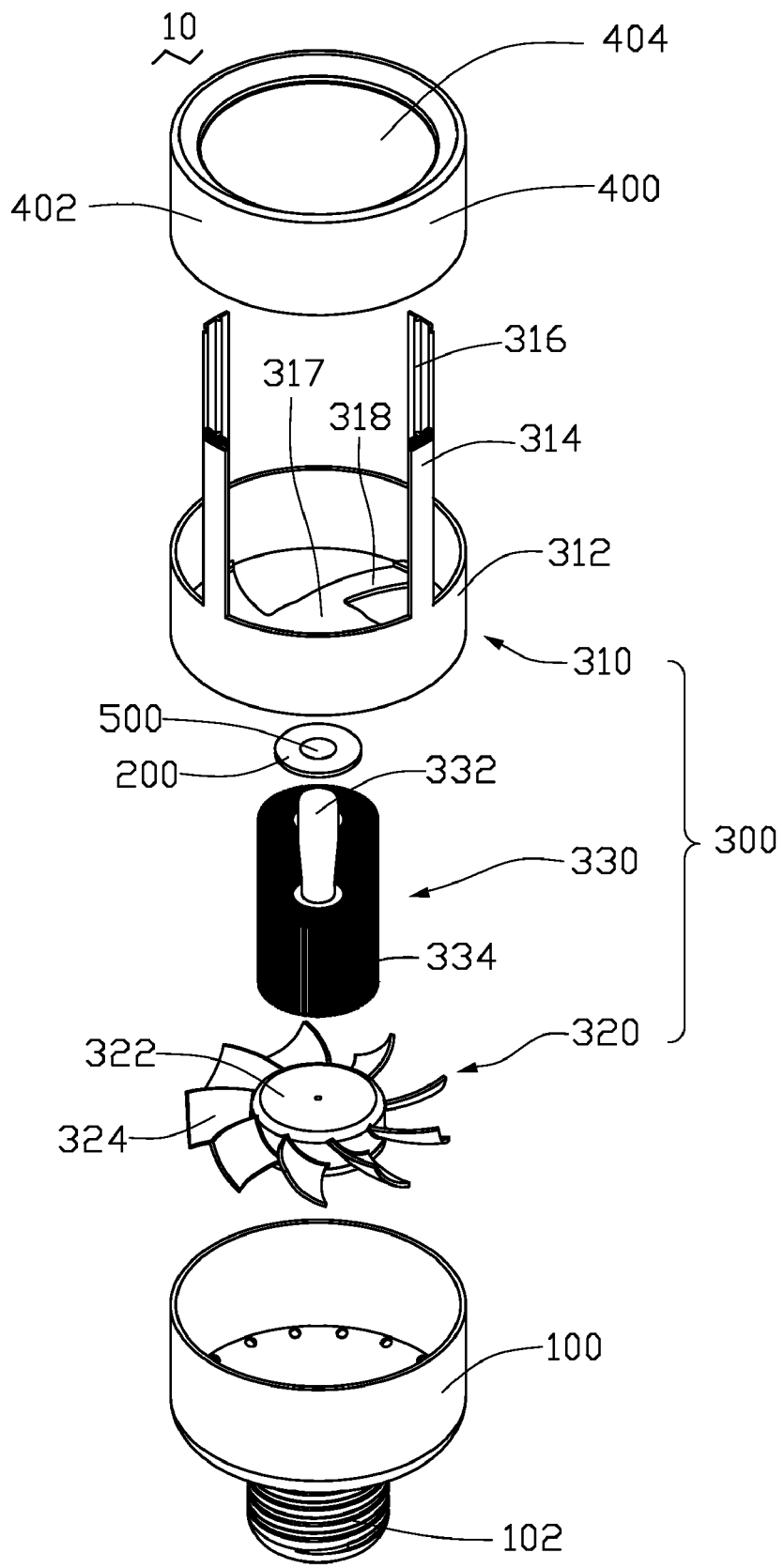
FIG. 2 is an exploded, isometric view of the LED lamp in FIG. 1.

Referring to FIGS. 1-2, a light emitting diode (LED) lamp 10 in accordance with a preferred embodiment of the present invention is illustrated. The LED lamp 10 comprises a lamp base 100, a heat conducting plate 200, a heat dissipation device 300, an optical lens system 400 and an LED 500 mounted in the optical lens system 400. The lamp base 100 has a threaded cap 102 at a bottom thereof. The threaded cap 102 is devised for threadedly engaging in a lamp socket (not shown) so that power can be supplied to the LED lamp 10.

The heat conducting plate 200 is made of heat conductive material such as copper. The LED 500 is mounted on the heat conducting plate 200 via soldering, adhering or the like. The heat dissipation device 300 thermally contacts with the heat conducting plate 200 and interconnects the lamp base 100 and the optical lens system 400. The optical lens system 400 has a tubular body 402 made of opaque plastic and a lens 404 mounted on a top end of the tubular body 402. The lens 404 is made of transparent plastic or glass. Light generated by the LED 500 transmits to an outside of the LED lamp 10 through the lens 404.

The heat dissipation device 300 comprises a frame 310, an impeller 320 disposed in the frame 310 and a thermal module 330 disposed above the impeller 320.

The frame 310 comprises a hollow, tubular shell 312 and four arms 314 symmetrically and upwardly extending from a top edge of the shell 312. The shell 312 has a bottom edge coupled to the lamp base 100 via adhesive or other conventional method. When the shell 312 is fixed on the lamp base 100, the arms 314 point to the optical lens system 400. The arms 314 are inserted into and firmly retained in the optical lens system 400 so that the frame 310 interconnects the lamp base 100 and the optical lens system 400. Preferably, the arms 314 each have a rib 316 formed thereon to strengthen the arms 314.

The frame 310 further comprises a rounded supporting portion 317 disposed in a bottom portion of the shell 312 and several connecting ribs 318. The connecting ribs 318 extend radially from a periphery of the supporting portion 317 towards the shell 312 so as to connect the supporting portion 317 with the shell 312. The supporting portion 317 is used to support the impeller 320 thereon.

The impeller 320 comprises a hub 322 and a plurality of blades 324 radially and outwardly extending from the hub 322. The impeller 320 is mounted on the supporting portion 317 in a conventional manner. The impeller 320 can be driven to rotate to blow airflow upwardly towards the thermal module 330.

Figure 3:
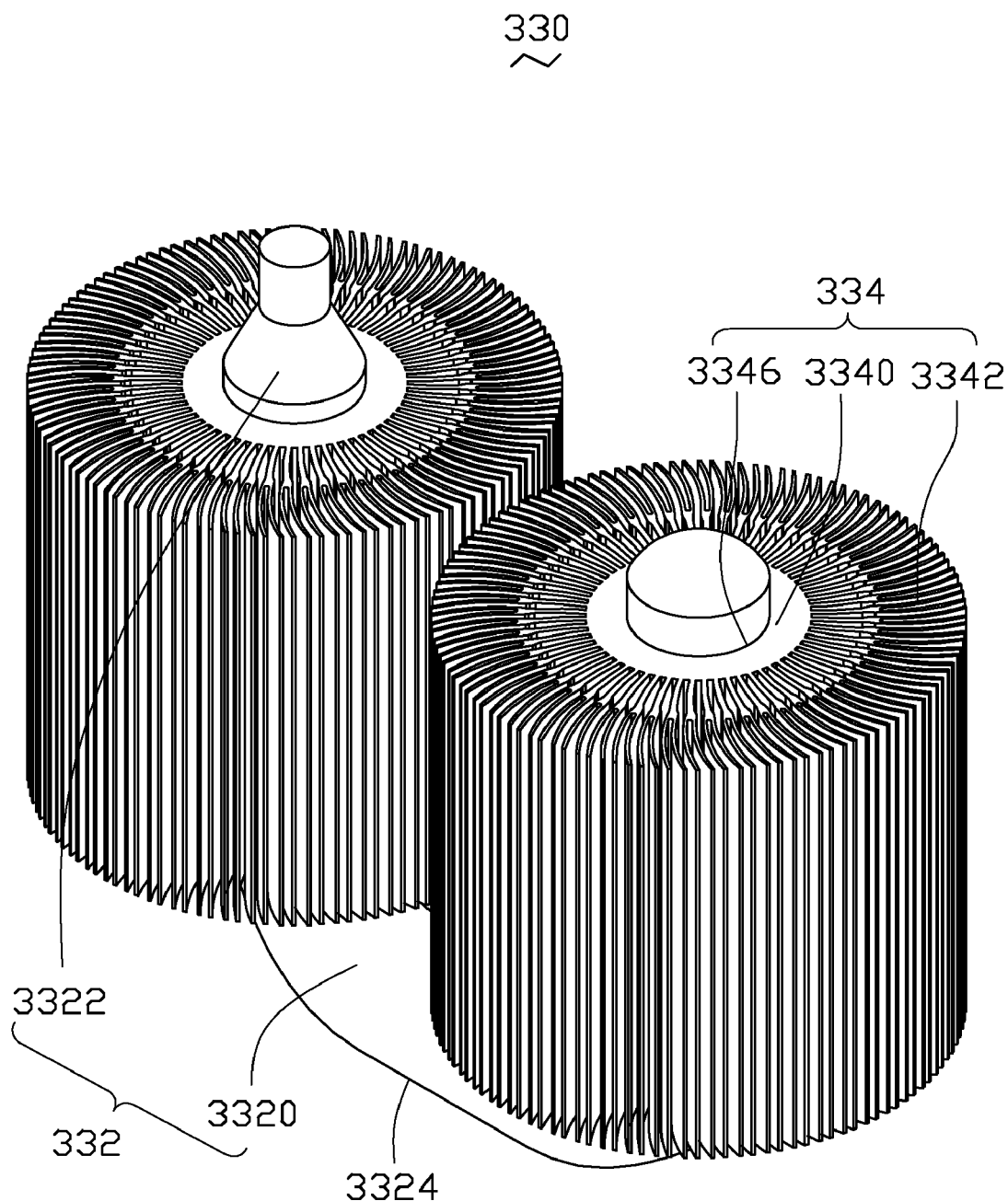
FIG. 3 is an enlarged, isometric view of a thermal module of the LED lamp in FIG. 2.

Referring to FIG. 3, the thermal module 330 comprises a heat pipe 332 and two same heat sinks 334. The heat pipe 332 has a U-shaped configuration, and comprises an evaporator 3320 and two parallel condensers 3322. The evaporator 3320 is flattened and has a flat bottom surface 3324 in direct contact with the heat conducting plate 200. The condensers 3322 extend perpendicularly from opposite ends of the evaporator 3320 into the heat sinks 334, respectively.

The two heat sinks 34 are juxtaposed with each other, and each comprise a cylindrical central block 3340 and a plurality of curved fins 3342 extending radially and outwardly from an outer circumferential face of the central block 3340. A receiving hole 3346 is defined axially through a center of the central block 3340 for receiving one of the condensers 3322 therein. The condensers 3322 are fitted in the receiving holes 3346, respectively. Preferably, the condensers 3322 can be press fitted into corresponding receiving holes 3346, as is, or after becoming encapsulated by heat-conducting paste or a soldering flux, to enhance the thermal conductivity of the attachment between condensers 3322 and the central blocks 3340.

During operation of the LED lamp 10, the LED 500 is powered to emit light in a conventional manner; the light emitted from the LED 500 is modulated by the optical lens system 400 and then is emitted to the outside. Meanwhile, the heat produced by the LED 500 is first absorbed by the heat conducting plate 200, and then is conducted to the evaporator 3320. The heat accumulated at the evaporator 3320 is transferred to the central blocks 3340 via the condensers 3322, and then is dissipated to ambient air through the fins 3342 under the help of the airflow generated by the impeller 320. Thus, the heat produced by the LED 500 is dissipated.

In the present invention, since the condensers 3322 of the heat pipe 332 are circumferentially enclosed by the corresponding central blocks 3340, the heat pipe 332 has a large contact area with both of the heat sinks 334. This helps to accelerate heat transfer from the condensers 3322 to the heat sinks 34. Therefore, the heat produced by the LED 500 can be quickly transferred to the heat sinks 334 via the heat pipe 332, and the LED lamp 10 can work within an acceptable temperature range.

Furthermore, the impeller 320, which is located under the heat sinks 334, drives the airflow to flow past the heat sinks 334 along a direction parallel to axes of the central blocks 3340. This accelerates heat conduction between the fins 3342 and the ambient air. Additionally, the airflow heated by the fins 3342 can quickly flow out of the LED lamp 10 through the large passages defined between adjacent arms 314. This helps to reduce heat buildup of the LED lamp 10.

Figure 4:
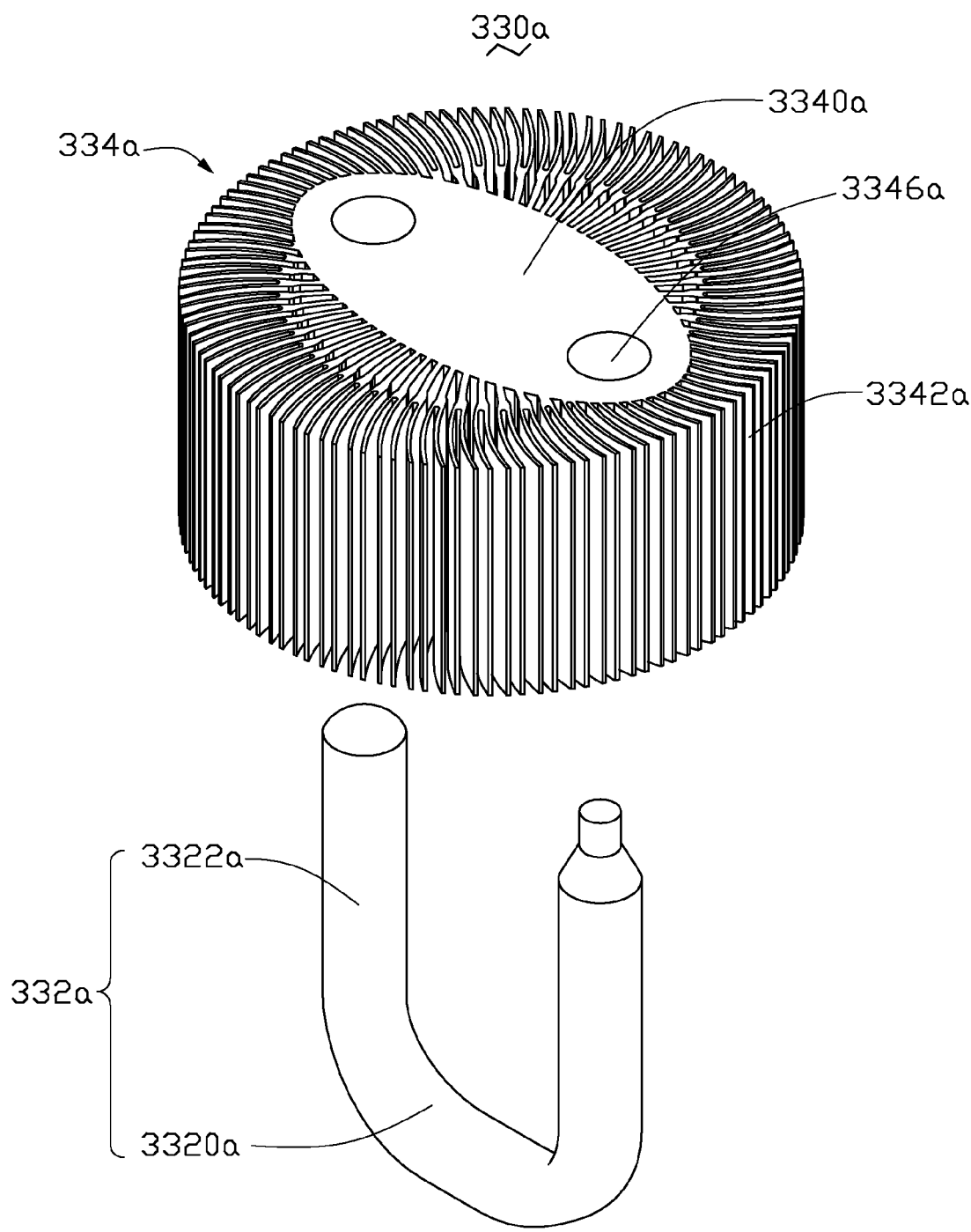
FIG. 4 is an exploded, isometric view of a thermal module in accordance with a second preferred embodiment of the present invention.

FIG. 4 illustrates a thermal module 330*a* in accordance with a second preferred embodiment of the present invention. The thermal module 330*a* can be used to replace the thermal module 330 so that the thermal module 330*a* can be used to cool the LED 500.

The thermal module 330*a* comprises a heat pipe 332*a* and a heat sink 334*a*. The heat pipe 332*a* has a U-shaped configuration, and comprises a flattened evaporator 3320*a* in thermal contact with the heat conducting plate 200 (shown in FIG. 2) and two condensers 3322*a*. The condensers 3322*a* extend perpendicularly and upwardly from opposite ends of the evaporator 3320*a*.

The heat sink 334*a* comprises a central block 3340*a* and a plurality of curved fins 3342*a* extending radially and outwardly from an outer circumferential face of the central block 3340*a*. The central block 3340*a* has an elliptical cross-section which is perpendicular to an axis of the central block 3340*a*. Two spaced receiving holes 3346*a* are defined axially through the central block 3340*a* for receiving the condensers 3322*a* therein. Preferably, the receiving holes 3346*a* are extended through two foci of the elliptical cross-section, respectively, which is perpendicular to the axis of the central block 3340*a*. The condensers 3322*a* are circumferentially embedded in the receiving holes 3346*a*, respectively.

Since there are two condensers 3322*a* simultaneously inserted into the central block 3340*a* and each condenser 3322*a* is enclosed by the central block 3340*a*, the heat pipe 332*a* has a large contact area with the central block 3340*a*. This helps to accelerate heat transfer from the condensers 3322*a* to the central block 3340*a*. Furthermore, since the central block 3340*a* has an elliptical cross-section which is perpendicular to the axis of the central block 3340*a*, the central block 3340*a* has a large contact area with the fins 3342*a*; this helps to accelerate heat transfer from the central block 3340*a* to the fins 3342*a*. Additionally, the condensers 3322*a* are preferably extended through the two foci of the elliptical cross-section, respectively; this helps to quickly spread the heat accumulated at the condensers 3322*a* to the whole central block 3340*a*.

Figure 5:
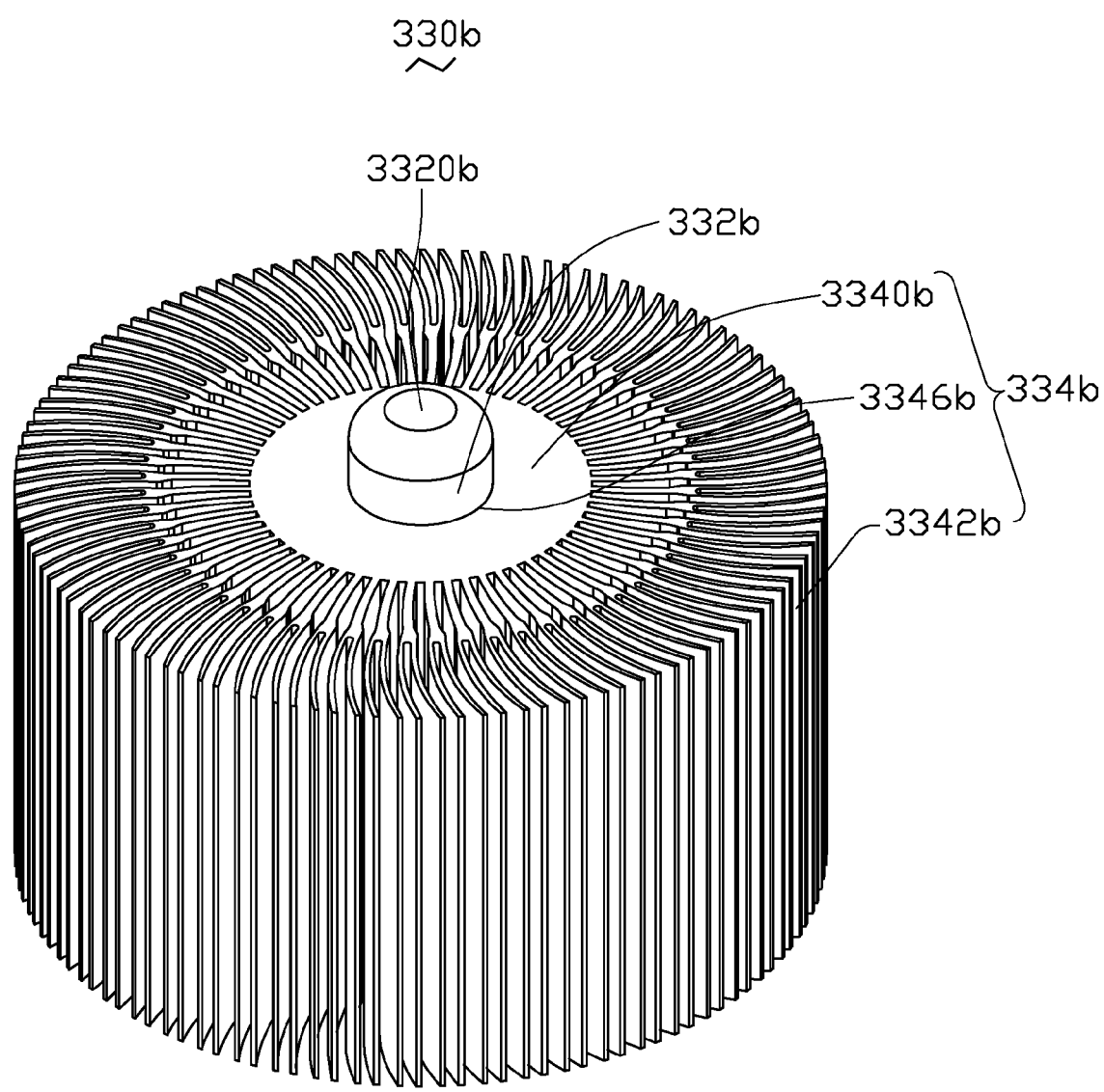
FIG. 5 is an isometric view of a thermal module in accordance with a third preferred embodiment of the present invention.

FIG. 5 illustrates a thermal module 330*b* in accordance with a third preferred embodiment of the present invention. The thermal module 330*b* can be used to replace the thermal module 330 so that the thermal module 330*b* can be used to cool the LED 500.

The thermal module 330*b* comprises a straight heat pipe 332*b* and a heat sink 334*b*. The heat pipe 332*b* has a flat top end 3320*b* in thermal contact with the heat conducting plate 200 (shown in FIG. 2). The heat sink 334*b* comprises a cylindrical central block 3340*b* and a plurality of curved fins 3342*b* extending radially and outwardly from an outer circumferential face of the central block 3340*b*. A receiving hole 3346*b* is defined axially through a center of the central block 3340*b* for receiving the straight heat pipe 332*b* therein. The straight heat pipe 332*b* is circumferentially embedded in the receiving hole 3346*b*.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A light emitting diode (LED) lamp comprising:
a lamp base;
an optical lens system;
an LED mounted in the optical lens system; and
a heat dissipation device interconnecting the lamp base and the optical lens system, the heat dissipation device comprising:
a heat sink comprising a central block, a plurality of fins extending radially and outwardly from an outer circumferential face of the central block and a receiving hole defined axially through the central block; and
a heat pipe interferentially fitted in the receiving hole and in thermal contact with the LED;
wherein the central block has an elliptical cross-section which is perpendicular to an axis of the central block.

2. The LED lamp of claim 1 further comprising a heat conducting plate on which the LED is mounted, the heat dissipation device being in thermal contact with the heat conducting plate.

3. The LED lamp of claim 1, wherein the heat pipe has an evaporator in thermal contact with the LED and two condensers extending from opposite ends of the evaporator into the central block.

4. The LED lamp of claim 3, wherein the heat sink further comprises another receiving hole defined axially through the central block, and the condensers are received in the receiving hole and the another receiving hole.

5. The LED lamp of claim 4, wherein the heat pipe has a U-shaped configuration.

6. The LED lamp of claim 4, wherein the receiving hole and the another receiving hole are extended through two foci of the elliptical cross-section of the central block, respectively.

7. An LED lamp comprising:
a lamp base adapted for connecting with a lamp socket thereby to receive power;
a heat dissipation device mounted on the lamp base, comprising:

a frame having a shell with a bottom connecting with the base and a plurality of arms extending upwardly from the shell;

at least a heat sink mounted in the frame, having a central block and a plurality of fins extending radially and outwardly from a circumference of the block; and a heat pipe having a first portion extending into the central block of the at least a heat sink and a second portion located outside the central block of the at least a heat sink;

a LED thermally connected with the second portion of the heat pipe; and an optical lens system having a tubular body connecting with the plurality of arms and a lens mounted at a top end of the tubular body.

8. The LED lamp of claim 7 further comprising a fan for generating an airflow through the at least a heat sink.

9. The LED lamp of claim 8, wherein the heat pipe is U-shaped, having an evaporator and two condensers extending from two opposite ends of the evaporator, the evaporator being located outside the central block of the at least a heat sink and in thermal connection with the LED, the condensers extending into the central block of the at least a heat sink.

10. The LED lamp of claim 8, wherein the at least a heat sink includes two juxtaposed heat sinks each having a central block and a plurality of fins extending radially and outwardly from a circumference of the central block of the each heat sink, and the heat pipe is U-shaped, having an evaporator and two condensers extending from two opposite ends of the evaporator, the evaporator being located outside the central blocks of the two heat sinks and in thermal connection with the LED, the condensers extending into the central blocks of the two heat sinks, respectively.

11. The LED lamp of claim 7, wherein the heat pipe is U-shaped, having an evaporator and two condensers extending from two opposite ends of the evaporator, the evaporator being located outside the central block of the at least a heat sink and in thermal connection with the LED, the condensers extending into the central block of the at least a heat sink.

12. The LED lamp of claim 7, wherein the at least a heat sink includes two juxtaposed heat sinks each having a central block and a plurality of fins extending radially and outwardly from a circumference of the central block of the each heat sink, and the heat pipe is U-shaped, having an evaporator and two condensers extending from two opposite ends of the evaporator, the evaporator being located outside the central blocks of the two heat sinks and in thermal connection with the LED, the condensers extending into the central blocks of the two heat sinks, respectively.

13. A light emitting diode (LED) lamp comprising:

a lamp base;

an optical lens system;

an LED mounted in the optical lens system; and a heat dissipation device interconnecting the lamp base and the optical lens system, the heat dissipation device comprising:

a heat sink comprising a central block, a plurality of fins extending radially and outwardly from an outer circumferential face of the central block and a receiving hole defined axially through the central block;

a heat pipe interferentially fitted in the receiving hole and in thermal contact with the LED; and another heat sink, the another heat sink comprising a central block, a plurality of fins extending radially and outwardly from an outer circumferential face of the central block of the another heat sink and a receiving hole defined axially through the central block of the another heat sink;

wherein the heat pipe comprises an evaporator in thermal contact with the LED and two condensers extending from opposite ends of the evaporator into the receiving hole of the heat sink and the receiving hole of the another heat sink, respectively.

14. The LED lamp of claim 13, wherein the heat pipe has a U-shaped configuration.

15. The LED lamp of claim 13, wherein the heat sink and the another heat sink are juxtaposed with each other.

16. The LED lamp of claim 13, wherein the heat dissipation device further comprises a frame, the frame comprises a hollow tubular shell and a plurality of arms pointing to the optical lens system, wherein the shell has an edge coupled to the lamp base, and the plurality of arms extend from the shell and are retained in the optical lens system.

17. The LED lamp of claim 16, wherein the heat dissipation device further comprises an impeller disposed in the shell to blow airflow toward the heat sink and the another heat sink.

18. The LED lamp of claim 16, wherein the arms each have a rib formed thereon to strengthen the arms.

* * * * *